(12) United States Patent
Blankenship et al.

(10) Patent No.: US 6,771,126 B2  
(45) Date of Patent: Aug. 3, 2004

(54) SLEW RATE ENHANCEMENT CIRCUIT AND METHOD

(75) Inventors: Tim Blankenship, Austin, TX (US); Stephen Bily, Austin, TX (US)

(73) Assignee: Winbond Electronics Corporation, Hsinchu (TW)

(*) Notice: Subject to any disclaimer, the term of this patent is extended or adjusted under 35 U.S.C. 154(b) by 0 days.

(21) Appl. No.: 10/109,633

(22) Filed: Apr. 1, 2002

(65) Prior Publication Data

US 2002/0158691 A1 Oct. 31, 2002

Related U.S. Application Data

(60) Provisional application No. 60/280,677, filed on Mar. 30, 2001.

(51) Int. Cl.[7] ............................................... H03F 3/45
(52) U.S. Cl. ...................................... 330/257; 330/261
(58) Field of Search ................................ 330/253, 255, 330/257, 261; 327/563

(56) References Cited

U.S. PATENT DOCUMENTS

| | | | | |
|---|---|---|---|---|
| 4,667,165 A | * | 5/1987 | De Weck | 330/253 |
| 5,465,054 A | | 11/1995 | Erhart | 326/34 |
| 5,471,169 A | * | 11/1995 | Dendinger | 327/563 |
| 5,510,748 A | | 4/1996 | Erhart et al. | 327/530 |
| 5,528,256 A | | 6/1996 | Erhart et al. | 345/96 |
| 5,572,211 A | | 11/1996 | Erhart et al. | 341/144 |
| 5,574,475 A | | 11/1996 | Callahan, Jr. et al. | 345/100 |
| 5,578,957 A | | 11/1996 | Erhart et al. | 327/333 |
| 5,604,449 A | | 2/1997 | Erhart et al. | 326/81 |
| 5,703,617 A | | 12/1997 | Callahan, Jr. et al. | 345/98 |
| 5,719,591 A | | 2/1998 | Callahan, Jr. et al. | 345/98 |
| 5,726,676 A | | 3/1998 | Callahan, Jr. et al. | 345/98 |
| 5,754,156 A | | 5/1998 | Erhart et al. | 345/98 |
| 5,818,252 A | | 10/1998 | Fullman et al. | 324/765 |
| 5,852,426 A | | 12/1998 | Erhart et al. | 345/96 |
| 6,040,815 A | | 3/2000 | Erhart et al. | 345/98 |
| 6,049,246 A | | 4/2000 | Kozisek et al. | 330/9 |

* cited by examiner

Primary Examiner—Steven J. Mottola  
(74) Attorney, Agent, or Firm—Finnegan, Henderson, Farabow, Garrett & Dunner, L.L.P.

(57) ABSTRACT

An apparatus for enhancing the slew rate of a differential amplifier capable of producing an output voltage and including a load stage, includes: a gain enhancement stage coupled to the load stage; a current comparator coupled to the differential amplifier and capable to compare a reference current value with a comparison current value; and a current mirror coupled to the current comparator and to the differential amplifier and capable to generate a slew rate enhancement bias current to enhance the slew rate of the output voltage when the comparison current value is greater the reference current value.

21 Claims, 5 Drawing Sheets

SLEW RATE ENHANCEMENT CIRCUIT AND METHOD

PRIORITY

Priority is claimed to the following U.S. provisional patent application:

Provisional U.S. Patent Application No. 60/280,677, entitled "Improved Switching Circuit for Column Display Driver," filed on Mar. 30, 2001.

U.S. patent application Ser. No. 10/109,632, entitled "Improved Switching Circuit for Column Display Driver," and filed on the same date herewith, which also claims priority to provisional U.S. Patent Application No. 60/280,677.

U.S. patent application Ser. No. 10/109,634, entitled "Analog Multiplex Level Shifter with Reset," and filed on the same date herewith, which also claims priority to provisional U.S. Patent Application No. 60/280,677.

TECHNICAL FIELD

This disclosure relates generally to amplifier circuits, and, more particularly, to circuits and methods for improving the slew rate of a differential amplifier circuit.

BACKGROUND

A slew rate is the maximum rate at which the output voltage of a device (e.g., an amplifier) can change. In other words, the slew rate is a measure of the ability of the device to follow its input signal. Typically, the slew rate is measured by applying a large amplitude step function to the device under test, and then measuring the slope of the output voltage waveform. The step function may be a signal starting at approximately zero (0) volt and then instantaneously rising to some large level, without overshooting or ringing, to create a step-like appearance as seen on an oscilloscope screen. The slew rate of, for example, an operational amplifier may be limited by the amplifier's frequency-compensation circuitry.

The slew rate is a parameter that can be a controlling factor in the performance characteristics of a device. A device having a low slew rate can degrade the performance and speed of a system with that device.

In FIG. 1, a block diagram is shown of a conventional differential amplifier 100 including a differential input stage having a P-channel transistor 110 with a gate configured to receive a first input voltage (V+) and P-channel transistor 115 with a gate configured to receive a second input voltage (V−). The sources of P-channel transistors 110 and 115 are coupled to a current source 120 that generates the current $I_B$. Differential amplifier 100 also includes a load stage with an N-channel transistor 125 having a drain coupled to the drain of P-channel transistor 110. The load stage also includes an N-channel transistor 130 with a drain coupled to the drain of P-channel transistor 115. N-channel transistors 125 and 130 are diode-connected (i.e., the gates of transistors 125 and 130 are tied to their respective drains). The sources of N-channel transistors 125 and 130 are coupled to a first supply voltage ($V_{SS}$) which may be a negative, positive, or ground voltage.

A P-channel transistor 135 has a source coupled to a second supply voltage $V_{DD}$ which has a higher potential than the first supply voltage ($V_{SS}$). P-channel transistor 135 is also diode-connected (i.e., the gate of transistor 135 is tied to its drain). An N-channel transistor 140 has a drain coupled to the drain of P-channel transistor 135, a gate coupled to the gate of N-channel transistor 130, and a source coupled to $V_{SS}$. A P-channel transistor 145 has a source coupled to $V_{DD}$ and a gate coupled to the gate of P-channel transistor 135. An N-channel transistor 150 has a drain coupled to the drain of P-channel transistor 145 and to an output terminal, a gate coupled to the gate of N-channel transistor 125, and a source coupled to $V_{SS}$.

A capacitor 160 with capacitance ($C_L$) coupled to the output terminal is the equivalent capacitance of the load which may represent a subsequent stage of the amplifier or a load external to the amplifier. The dc output voltage ($V_{OUT}$), is expressed by equation (1):

$$V_{OUT} = A_{OL}[((V+)-(V-))-V_{OFFSET}] \qquad (1)$$

where $V_{OFFSET}$ is an input-referred offset voltage value, and $A_{OL}$ is the open loop gain of the amplifier 100.

The following performance issues concern differential amplifier 100. It is desirable to improve slew rate and settling time of differential amplifier 100.

FIG. 2 is a waveform diagram illustrating the settling times and slew rates for an ideal output signal 200 and for a typical output signal 205 as a function of voltage (e.g., volts) versus time (e.g., micro-seconds). The settling time is defined as the time taken for the output to settle to its new value (within a certain error) when a step change in input signal occurs. For ideal output signal 200, the settling time is zero (0) micro-second. For typical output signal 205, the settling time 210 may be greater than zero (0) micro-second. For ideal output signal 200, the slew rate 215 is infinite (∞) V/micro-seconds or a vertical line. For a typical output signal 205, the slew rate 220 is typically less than infinite (∞) V/micro-seconds as shown by, for example, the sloped line 220.

Referring again to differential amplifier 100 in FIG. 1, the slew rate is typically limited by the maximum current that can be driven into the output load capacitance $C_L$ of capacitor 160 when the inputs are skewed (one input substantially greater than the other). Assuming a current gain of α from the load stage (transistors 125 and 130) to the output stage (transistors 150 and 145) the slew rate is given by the following equation:

$$\text{Slew Rate} = I_{OUT,max}/C_L = (\alpha)I_B/C_L$$

For a given load capacitance, the slew rate can be improved by increasing the quiescent bias current, $I_B$, at the expense of higher quiescent power dissipation, or by increasing α at the expense of higher power dissipation and possible stability issues. The slew rate capability of differential amplifier 100, therefore, becomes highly constrained in low power applications where low quiescent bias currents are required, and in applications with large capacitive loads.

Amplifiers interposed between a digital-to-analog converter ("DAC") and a panel (e.g., a flat panel display) improve the operating characteristics of display systems by isolating the panel capacitance from the DAC. Many conventional amplifier architectures, including the differential amplifier in FIG. 1, may employ fixed bias currents, sometimes called class-A biasing, to set the operating characteristics of some or all parts of the amplifier. While class-A amplifiers provide stable supply loading, relatively simple designs, and other benefits, their slew rate is constrained by the fixed bias currents. The constrained slew rate may be inadequate in some applications, especially those requiring low power (i.e., low bias currents) and/or high capacitive loads. Therefore, there is a need to improve the slew rate and settling time for these types of amplifiers in order to improve system performance and speed.

SUMMARY

Embodiments of systems and methods for enhancing the slew rate of a differential amplifier circuit are disclosed herein. In an exemplary embodiment, an apparatus for enhancing a slew rate of a differential amplifier comprises a gain enhancement stage coupled to a load, a current comparator coupled to the gain enhancement stage and a differential amplifier to compare a reference current value with a comparison current value, and a current mirror coupled to the current comparator and to the differential amplifier to generate a slew rate enhancement bias current to enhance the slew rate of the output voltage, wherein the comparison current value is greater the reference current value.

In another exemplary embodiment, an apparatus for enhancing a slew rate of a differential amplifier, comprising a gain enhancement stage, a load coupled to the gain enhancement stage, a current comparator coupled to the load and the gain enhancement stage, and a current mirror coupled to the current comparator, the gain enhancement stage, and the load.

Accordingly, the invention advantageously provides a circuit and method that enhance the slew rate of a differential amplifier. The invention may enhance the amplifier slew rate, while requiring less die space and/or power as compared to previous approaches for improving an amplifier slew rate. The invention may also advantageously minimize quiescent current in low power applications. The invention may also advantageously improve system performance and/or speed by providing an amplifier with an enhanced slew rate feature.

BRIEF DESCRIPTION OF THE DRAWINGS

It is to be understood that both the foregoing general description and the following detailed description are exemplary and explanatory only and are not restrictive of the invention as claimed. The accompanying drawings, which are incorporated in and constitute a part of this specification, illustrate possible embodiments of the invention and together with the description, serve to explain the principles of the invention. In the drawings:

DETAILED DESCRIPTION

In a possible embodiment, the present invention provides a method and apparatus, which improve the slew rate of the differential amplifier without requiring high quiescent power dissipation.

Figure 1:
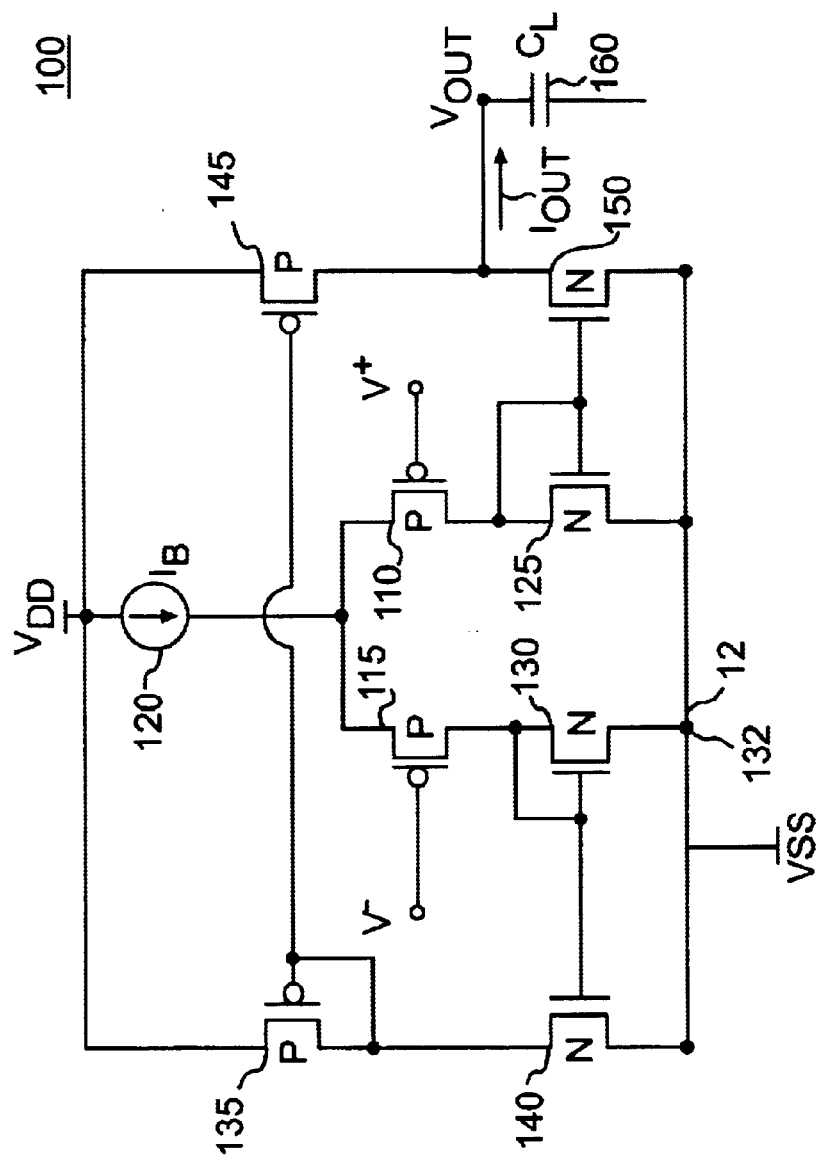
FIG. 1 is a schematic circuit diagram of a conventional differential amplifier circuit.
Figure 2:
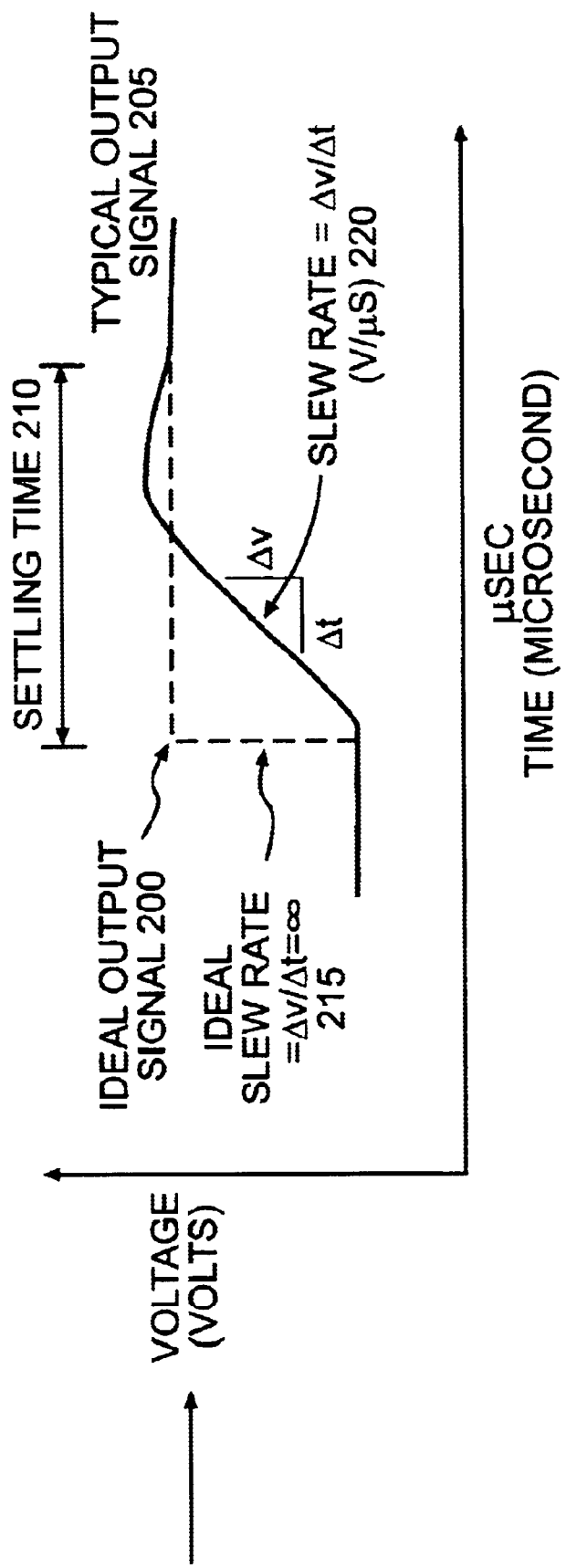
FIG. 2 is a waveform diagram illustrating the slew rates and settling times for an ideal output signal and for a typical output signal as a function of voltage versus time.
Figure 3:
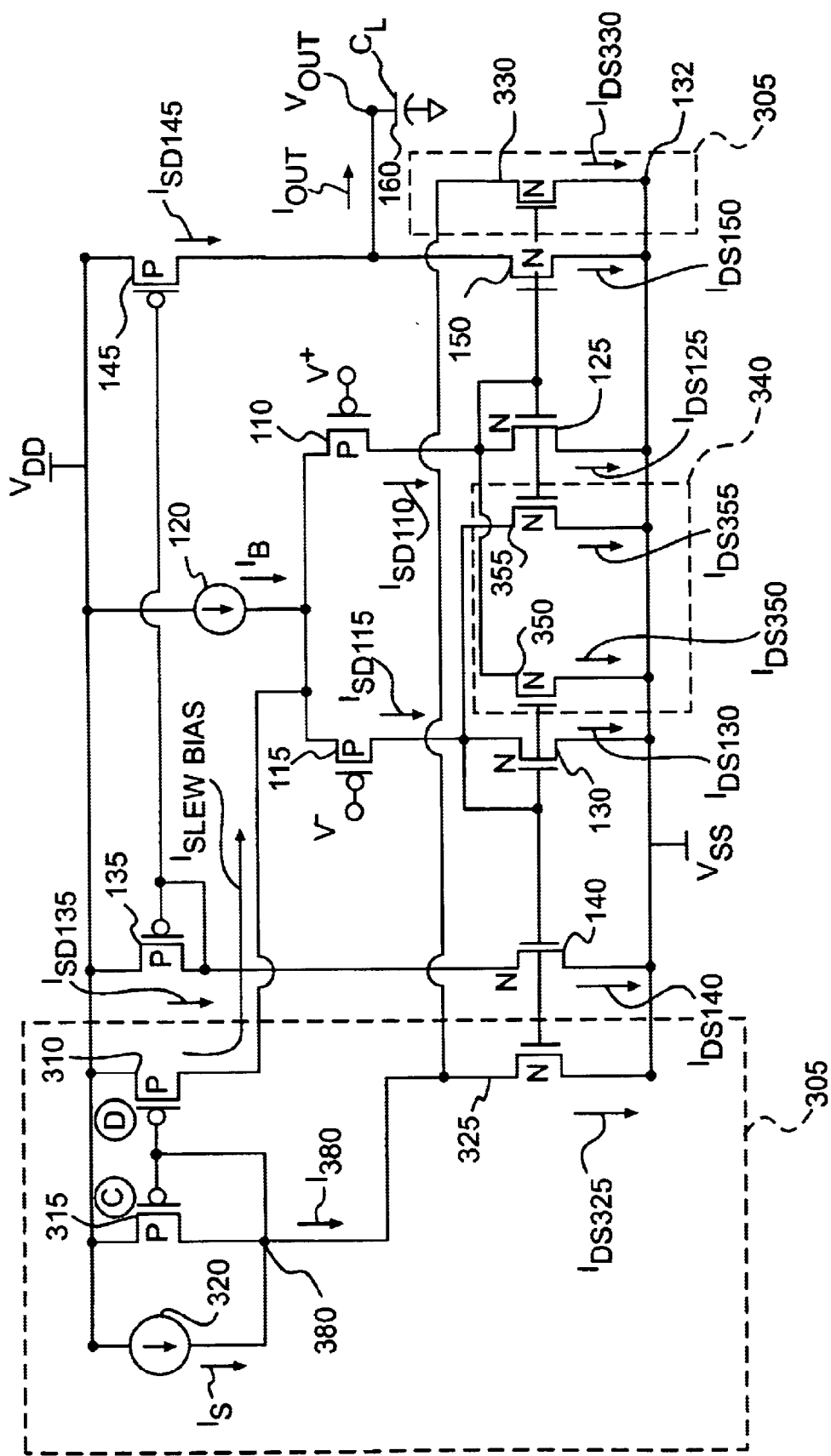
FIG. 3 is a schematic circuit diagram of a differential amplifier circuit with slew rate enhancement in accordance with an embodiment of the invention.

FIG. 3 is a schematic circuit diagram of a differential amplifier circuit 300 with slew rate enhancement control in accordance with an embodiment of the invention. The differential amplifier circuit 300 includes a slew rate enhancement circuit 305, as described below, and components as similarly shown in the differential amplifier 100 of FIG. 1 (e.g., a differential input stage formed by transistors 110 and 115, a load stage having two diode-connected load transistors 125 and 130, a current source 120, and current mirror components 135, 140, 145 and 150).

In one embodiment, the slew rate enhancement circuit 305 comprises the following elements: a P-channel transistor 310, a P-channel transistor 315, a current source 320, an N-channel transistor 325, and an N-channel transistor 330. P-channel transistor 310 has a source coupled to $V_{DD}$ and a drain coupled to the sources of P-channel transistors 110 and 115. P-channel transistor 315 has a source coupled to $V_{DD}$ and a gate coupled to the gate of P-channel transistor 310. P-channel transistor 315 is also diode-connected (i.e., the gate of transistor 315 is connected to its drain). Current source 320 is coupled to $V_{DD}$ and to the drains of P-channel transistor 315 and N-channel transistor 325. N-channel transistor 325 has a gate coupled to the gates of N-channel transistors 140 and 130, and a source coupled to $V_{SS}$. N-channel transistor 330 has a drain coupled to the drain of N-channel transistor 325, a gate coupled to the gates of N-channel transistors 150 and 125, and a source coupled to $V_{SS}$.

Additional elements are used to enhance the gain of amplifier 300 (or effectively increase the impedance of the output load transistors 125 and 130). In the embodiment of FIG. 3, gain enhancement stage 340 comprises N-channel transistors 350 and 355. N-channel transistor 350 has a source coupled to $V_{SS}$, a drain coupled to the gates of transistors 125, 150, and 330, and gate coupled to the gates of transistors 130, 140, and 325. N-channel transistor 350 drain is also coupled to N-channel transistor 125 drain since transistor 125 is diode-connected. N-channel transistor 355 has a source coupled to $V_{SS}$, a drain coupled to the gates of transistors 130, 140, and 325, and a gate coupled to the gates of transistors 125, 150, and 330. N-channel transistor 355 drain is also coupled to N-channel transistor 130 drain since transistor 130 is diode-connected. As described below, from a DC viewpoint, transistors 350 and 355 may also reduce the current flow in transistors 125 and 130, respectively.

It is noted that other device configurations may be used to enhance the gain of amplifier 300. One example comprises current sources coupled to each drain of load transistors 125 and 130 to reduce the current flow in transistors 125 and 130.

An example will now be described below for purposes of describing an operation of differential amplifier circuit 300 under a balanced state and under a skewed state. In this example, the following transistors are equally matched in size with each other in FIG. 3: transistor 110 with transistor 115; transistors 125, 130, 140, 150, 325, and 330 with each other; transistor 135 with transistor 145; transistor 350 with transistor 355; and transistor 310 with transistor 315.

Additionally in the following example, amplifier circuit 300 is connected in a unity gain configuration (i.e., amplifier 300 output voltage $V_{OUT}$ is fed into the V– input voltage terminal). In the following example, the ratio of the combined sizes of transistors 350 and 355 with the combined sizes of transistors 130 and 125 is about 4/6. It is noted, however, that other ratio values may be used. If the ratio of 4/6 is used, then 40% of source-to-drain current ($I_{SD115}$) of transistor 115 flows in the source-to-drain path of transistor 355, and 60% of $I_{SD115}$ flows in the source-to-drain path of transistor 130 when the amplifier is balanced (V+=V–). Similarly, based on the 4/6 ratio, 40% of source-to-drain current ($I_{SD110}$) of transistor 110 flows in the source-to-drain path of transistor 350, and 60% of $I_{SD110}$ flows in the source-to-drain path of transistor 125 when the amplifier is balanced.

Balanced State:

During the balanced state, there is no need to enhance the slew rate of amplifier 300 output voltage $V_{OUT}$ because the output voltage $V_{OUT}$ has already settled. In the balanced state, the input voltages are equal (i.e., V+=V−). The current $I_B$ from current source 120 will be split approximately evenly between $I_{SD110}$ and $IS_{D115}$ so that $I_{SD110}≈(0.5) I_B$ and $I_{SD115}≈(0.5) I_B$. The drain-to-source current values ($I_{DS}$) of particular transistors are shown by the following equations.

Since the ratio between the sizes of transistors 350 and 125 is 4/6 in this example, the $I_{DS}$ values for transistor 350 and transistor 125 are shown by equation (2) and equation (3), respectively:

$$I_{DS350}=I_{SD110}(40\%)=(0.5)I_B(40\%)=(0.2)I_B \quad (2)$$

$$I_{DS125}=I_{SD110}(60\%)=(0.5)I_B(60\%)=(0.3)I_B \quad (3)$$

Since the ratio between the sizes of transistors 355 and 130 is 4/6 in this example, the $ID_S$ values for transistor 355 and transistor 130 are shown by equation (4) and equation (5), respectively:

$$I_{DS355}=I_{SD115}(40\%)=(0.5)I_B(40\%)=(0.2)I_B \quad (4)$$

$$I_{DS130}=I_{SD115}(60\%)=(0.5)I_B(60\%)=(0.3)I_B \quad (5)$$

The $I_{DS130}$ current value will be mirrored in the drain-to-source current value of transistor 140 ($I_{DS140}$) as well as in transistors 135 and 145 (i.e., $I_{SD145}=I_{SD135}=I_{DS140}=I_{DS130}=(0.3) I_B$). The $I_{DS125}$ current value will be mirrored in the drain-to-source current value of transistor 150 ($I_{DS150}$) (i.e., $I_{DS150}=I_{DS125}=(0.3)I_B$). Since the currents in the output stage are equal ($I_{SD145}=I_{DS150}$) the output current ($I_{OUT}$) is zero, as desired during the balanced state.

The $I_{DS130}$ current value will also be mirrored in the drain-to-source current value ($I_{DS325}$) of transistor 325 (i.e., $I_{DS325}=I_{DS130}=(0.3)I_B$). The $I_{DS125}$ current value will be mirrored in the drain-to-source current value ($I_{DS330}$) of transistor 330 (i.e., $I_{DS330}=I_{DS125}=(0.3) I_B$).

The current through node 380 ($I_{380}$) under the balanced state is given by equation (6):

$$I_{380}=I_{DS325}+I_{DS330}=(0.3)I_B+(0.3)I_B=(0.6)I_B \quad (6)$$

Assuming in this example that the current from current source 320 ($I_S$) is set to, for example, (0.8) $I_B$, then $I_S>I_{380}$. Since $I_S>I_{380}$, the node 380 will rise to the positive value $V_{DD}$, thus resulting in the $V_{DD}$ value being driven into the gates of P-channel transistors 315 and 310. Therefore, the P-channel transistors 315 and 310 will shut off, and a bias current $I_{SLEWBIAS}$ for enhancing the slew rate will have an approximately zero (0) value. Since $I_{SLEWBIAS}$ will be equal to approximately zero (0), the slew rate of $V_{OUT}$ is properly not enhanced during the balanced state.

As also seen above, the transistors 350 and 355 advantageously reduce the amount of current flowing in the source-to-drain path of P-channel transistor 145 and drain-to-source path of N-channel transistor 150.

Skewed State:

If a large positive step value is applied to the gate of transistor 110 so that V+>V−, then amplifier 300 will be in a skewed state. During the skewed state, there is a need to enhance the slew rate of amplifier 300 output voltage $V_{OUT}$ because the output voltage $V_{OUT}$ needs to rise in response to the applied positive step value at the gate of transistor 110. The current from current source 120 ($I_B$) will now be diverted through transistor 115 because transistor 110 will be shutting off. Thus, $I_{SD115}$ will increase from (0.5) $I_B$ to (1.0) $I_B$, and $I_{SD110}$ will decrease from (0.5) $I_B$ to (0.0) $I_B$. When $I_{SD110}$ goes to (0.0) $I_B$, transistors 125 and 355 shut off. Transistor 355 shuts off since its gate receives no voltage from the gate of transistor 125. Additionally, transistor 350 will shut off because its drain-to-source voltage will be zero as the drain of transistor 350 is pulled by the gate of transistor 125 to zero (0). Therefore, in this skewed condition, transistor 130 receives all of $I_{SD115}$ (i.e., $I_{DS130}≈I_{SD115}=I_B$).

The current value of $I_{DS130}$ will be mirrored in the drain-to-source current value of transistor 325 ($I_{DS325}$) (i.e., $I_{DS325}=I_{DS130}=I_B$). The drain-to-source current value ($I_{DS330}$) of transistor 330 will be zero (0) since it receives the zero (0) value from the gate of transistor 125. In this example, the $I_S$ current from current source 320 is set to $I_S=(0.8) I_B$. Therefore, $I_{380}>I_S$, since $I_{380}=I_{DS325}+I_{DS330}=I_B$. Since $I_{380}$ exceeds $I_S$ by (0.2) $I_B$, transistor 315 has a current of approximately (0.2) $I_B$ flowing through its source-to-drain path. This (0.2) $I_B$ value is mirrored through the source-to-drain path of transistor 310. Therefore, $I_{SLEWBIAS}=(0.2) I_B$. Current source 320 and transistors 325 and 330 in the configuration shown in FIG. 3 effectively form a current comparator for determining the value of the slew enhancement bias current $I_{SLEWBIAS}$.

The (0.2) $I_B$ value of $I_{SLEWBIAS}$ now sums with the $I_B$ value from current source 120 to increase the effective bias current available at the differential input stage, transistors 110 and 115, to (1.2) $I_B$. While the amplifier remains in the skewed state, the increased current will continue to mirror and grow around the positive feedback loop created by transistors 115, 130, 325, 315, and 310. If the current gain around the loop equals or exceeds 1, the $I_{SLEWBIAS}$ value can continue to grow larger until a portion of the loop runs out of headroom, thereby limiting $I_{SLEWBIAS}$. The maximum value of $I_{SLEWBIAS}$ is limited by the sizing of the devices around the loop and by the supply voltage ($V_{DD}-V_{SS}$), and may equal many multiples of $I_B$.

The increased current, ($I_{SLEWBIAS}+I_B$), flowing in the drain-to-source path of transistor 130 ($I_{DS130}$) also is mirrored to transistors 140, 135 and 145, so that $I_{SD145}=I_{SD135}=I_{DS140}=I_{DS130}=(I_{SLEWBIAS}+I_B)$. Since the mirrored drain-to-source current ($I_{DS150}$) of transistor 150 is zero (0), the output current will equal:

$$I_{OUT}=I_{SD145}=I_{DS150}=(I_{SLEWBIAS}+I_B).$$

The positive $I_{OUT}$ current acts to pull up the output in the desired direction. Since $I_{OUT}=I_{SLEWBIAS}+I_B>>I_B$, the slew rate of output voltage $V_{OUT}$ will be enhanced. Without the slew enhancement circuit 305, $I_{OUT}$ will equal approximately only $I_B$.

In the skewed condition, the voltage at V− (which is tied to $V_{OUT}$ in this example) will rise to the value of the voltage at V+ as $V_{OUT}$ increases with the enhanced slew rate, thus resulting again in a balanced state for the amplifier 300.

Figure 3A:
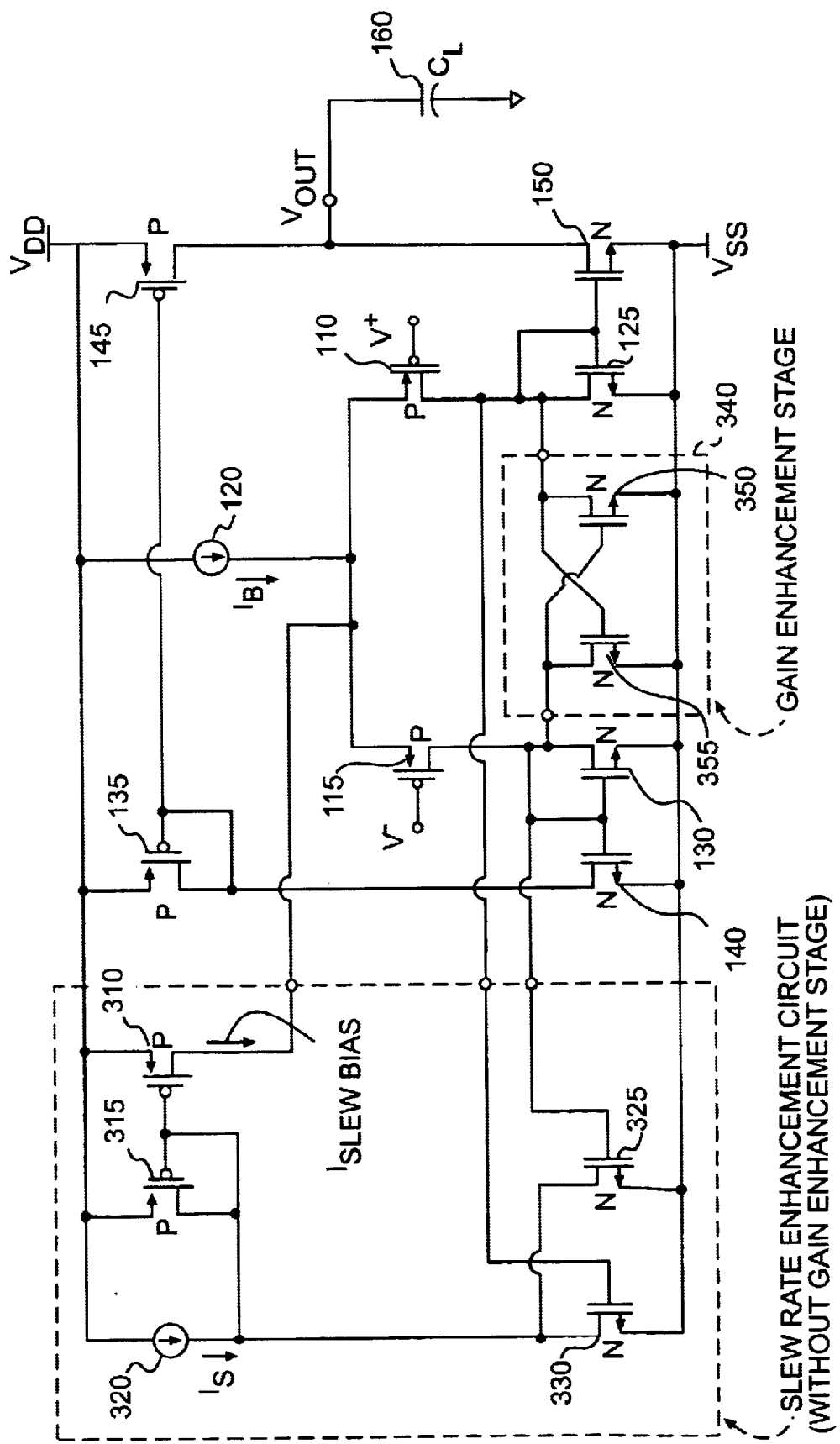
FIG. 3A is an alternative schematic of the circuit shown in FIG. 3.

FIG. 3A is an alternative schematic of the circuit shown in FIG. 3.

Figure 4:
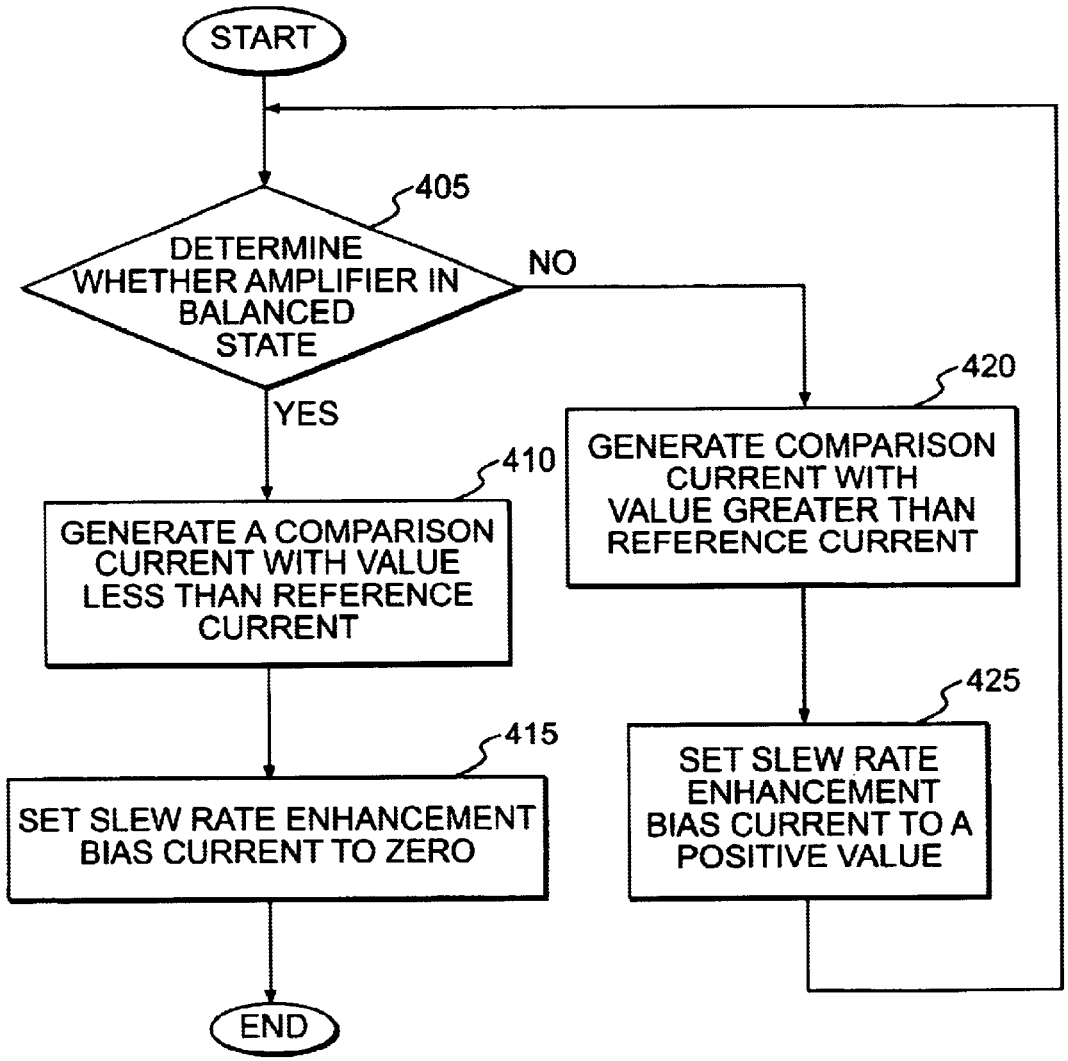
FIG. 4 is a flowchart diagram of a method of enhancing the slew rate of a differential amplifier circuit in accordance with an embodiment of the invention.

FIG. 4 is a flowchart diagram of a method of enhancing the slew rate of a differential amplifier circuit in accordance with an embodiment of the invention. The method begins with a determination whether the amplifier circuit is in a balanced state or a skewed state (step 405). For example, amplifier circuit 300 in FIG. 3 is in the balanced state if the input voltages V+ and V− are approximately equal. Amplifier circuit 300 is in the skewed state if V+>V− or V−>V+. If the amplifier circuit is in the balanced state, then a comparison current is generated where the comparison current value is less than a reference current ($I_S$) value (step

410). In the amplifier circuit 300 of FIG. 3, the comparison current is the sum of $I_{DS325}$ and $I_{DS330}$. Since the comparison current is less than the reference current ($I_S$), a slew rate enhancement bias current ($I_{SLEWBIAS}$) is set to zero in order to prevent the enhancement of the slew rate of the output voltage of amplifier 300 (step 415).

If, on the other hand, the amplifier is determined not to be in a balanced state, i.e., a skewed state, then a comparison current is generated where the comparison current is greater than the reference current ($I_S$) (step 420). Since the comparison current is greater than the reference current ($I_S$), the slew rate enhancement bias current ($I_{SLEWBIAS}$) is set to a positive value in order to enhance the slew rate of the output voltage of amplifier 300 (step 425). The method then repeats to determine whether the amplifier is in the balanced state or in the skewed state (step 405) and proceeds based on the result.

Other variations and modifications of the above-described embodiments and methods are possible in light of the foregoing teaching. For example, an embodiment of the invention is also applicable for enhancing an amplifier circuit with the input differential pair using N-channel transistors instead of the P-channel transistors shown in FIG. 3. In this other embodiment, N-channel transistors (125, 130, 140, 150, 325, 330, 350, and 355) shown in FIG. 3 are replaced with P-channel transistors, while P-channel transistors (110, 115, 135, 145, 310, and 315) shown in FIG. 3 are replaced with N-channel transistors. Thus, the input voltages, V+ and V−, will be received at the gate of a first N-channel transistor and second N-channel transistor, respectively. In addition, the $V_{DD}$ positive voltage source shown in FIG. 3 is replaced with the $V_{SS}$ negative voltage source, while the $V_{SS}$ negative voltage source shown in FIG. 3 is replaced with the $V_{DD}$ positive voltage source.

As another example, components of this invention may be implemented using field programmable gate arrays (FPGAs), using application specific integrated circuits (ASICs), using discrete elements, or using a network of interconnected components and circuits. Connections may be wired, wireless, modem, and the like.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus for enhancing a slew rate of a differential amplifier, the apparatus comprising:
   a gain enhancement stage coupled to a load;
   a current comparator coupled to the gain enhancement stage and a differential amplifier to compare a reference current value with a comparison current value; and
   a current mirror coupled to the current comparator and to the differential amplifier to generate a slew rate enhancement bias current to enhance the slew rate of an output voltage, wherein the comparison current value is greater than the reference current value.

2. The apparatus of claim 1, wherein the current mirror sets the stew rate enhancement bias current to a positive value when the comparison current value is greater than the reference current value.

3. The apparatus of claim 1, wherein the current mirror sets the slew rate enhancement bias current to zero when the comparison current value is less than the reference current value.

4. The apparatus of claim 1, wherein the current comparator compares the reference current value with a comparison current value, which is proportional to the sum of currents in the load.

5. The apparatus of claim 1, wherein the current comparator comprises:
   a first transistor having a first terminal, a second terminal coupled to a reference voltage source, an input terminal coupled to the load and to the gain enhancement stage;
   a second transistor having a first terminal coupled to the first terminal of the first transistor, a second terminal coupled to the reference voltage source, and an input terminal coupled to the load and to the gain enhancement stage; and
   a current source having a first terminal coupled to a positive voltage source and a second terminal coupled to the first terminal of the first transistor and the second transistor, the current source further capable to generate the reference current value.

6. The apparatus of claim 5, wherein:
   the first transistor is an N-channel transistor; and
   the second transistor is an N-channel transistor.

7. The apparatus of claim 1, wherein the gain enhancement stage comprises:
   a first gain enhancement current source with a first terminal coupled to the load, and a second terminal coupled to a reference voltage source; and
   a second gain enhancement current source with a first terminal coupled to the load, and a second terminal coupled to the reference voltage source.

8. The apparatus of claim 1, wherein the gain enhancement stage comprises:
   a first gain enhancement transistor with a first terminal coupled to the load, a second terminal coupled to the reference voltage source, and an input terminal coupled to the current comparator; and
   a second gain enhancement transistor with a first terminal coupled to the load, a second terminal coupled to the reference voltage source, and an input terminal coupled to the current comparator.

9. The apparatus of claim 8, wherein:
   the first gain enhancement transistor is an N-channel transistor; and
   the second gain enhancement transistor is an N-channel transistor.

10. An apparatus for enhancing a slew rate of a differential amplifier, comprising:
    a gain enhancement stage;
    a load coupled to the gain enhancement stage;
    a current comparator coupled to the toad and the gain enhancement stage; and
    a current mirror coupled to the current comparator, the gain enhancement stage, and the load for generating a stew rate enhancement bias current.

11. The apparatus of claim 10, wherein the current comparator comprises:
    a first transistor having a first terminal, a second terminal coupled to a reference voltage source, an input terminal coupled to the load and to the gain enhancement stage;
    a second transistor having a first terminal coupled to the first terminal of the first transistor, a second terminal coupled to a reference voltage source, and an input terminal coupled to the load and to the gain enhancement stage; and
    a current source having a first terminal coupled to a positive voltage source and a second terminal coupled to the first terminals of the first transistor and the second transistor.

12. The apparatus of claim 10, wherein the gain enhancement stage comprises:

a first gain enhancement transistor with a first terminal coupled to the load, a second terminal coupled to a reference voltage source, and an input terminal coupled to the current comparator; and a second gain enhancement transistor with a first terminal coupled to the load, a second terminal coupled to the reference voltage source, and an input terminal coupled to the current comparator.

13. The apparatus of claim 10, wherein the gain enhancement stage comprises:

a first gain enhancement current source with a first terminal coupled to the load, and a second terminal coupled to a reference voltage source; and a second gain enhancement current source with a first terminal coupled to the load, and a second terminal coupled to the reference voltage source.

14. A method of enhancing a slew rate of a differential amplifier, the method comprising:

determining a state of an amplifier;

generating a comparison current value that is less than a reference current value and, responsive to the comparison current value, setting a slew rate enhancement bias current to a zero value when the amplifier is in a balanced state; and generating a comparison current value that is greater than the reference current value and, responsive to the comparison current value, setting a slew rate enhancement bias current to a positive value when the amplifier is in a skewed state.

15. The method of claim 14, wherein the skewed state is when a first input voltage and a second input voltage are not substantially equal.

16. The method of claim 14, wherein the balanced state is when a first input voltage and a second input voltage are substantially equal.

17. The method of claim 14 further comprising reducing the slew rate enhancement bias current to approximately a zero value when the differential amplifier achieves the balanced state.

18. A method of controlling a slew rate in a differential amplifier, the method comprising:

determining values of a first input voltage and a second input voltage;

generating a comparison current value that is less than a reference current value in order to set a slew rate enhancement bias current to a zero value when the values of the first input voltage and the second input voltage are substantially equal; and generating a comparison current value that is greater than a reference current value in order to set a slew rate enhancement bias current to a positive value for enhancing the slew rate of an output voltage of the differential amplifier when the values first input voltage and second input voltage are not substantially equal.

19. The method of claim 18, further comprising setting the slew rate enhancement bias current to a zero value when the values of the first input and the second input are substantially equal.

20. A method of controlling a slew rate in a differential amplifier, the method comprising:

providing a first input voltage;

providing a second input voltage;

comparing the first input voltage and the second input voltage; and generating a comparison current value that is less than a reference current value in order to set a slew rate enhancement bias current to a zero value when the first input voltage is substantially equal to the second input voltage, wherein the comparison current value is the sum of currents passing through load transistors, and the reference current value is provided by a current source.

21. A method of controlling a slew rate in a differential amplifier, the method comprising:

providing a first input voltage;

providing a second input voltage;

comparing the first input voltage and the second input voltage; and generating a comparison current value that is greater than a reference current value in order to set a slew rate enhancement bias current to a positive value for enhancing the slew rate of an output voltage of the differential amplifier when the first input voltage and second input voltage are substantially unequal, wherein the comparison current value is the sum of currents passing through load transistors, and the reference current value is provided by a current source.

* * * * *